(12) United States Patent
Shin et al.

(10) Patent No.: US 8,680,517 B2
(45) Date of Patent: Mar. 25, 2014

(54) ORGANIC LIGHT EMITTING DIODE DISPLAY DEVICE AND METHOD OF MANUFACTURING THE SAME

(75) Inventors: Aram Shin, Seoul (KR); Juhn-Suk Yoo, Goyang-si (KR); Soo-Jeong Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/495,907

(22) Filed: Jun. 13, 2012

(65) Prior Publication Data

US 2013/0221381 A1    Aug. 29, 2013

(30) Foreign Application Priority Data

Feb. 23, 2012    (KR) .................. 10-2012-0018612

(51) Int. Cl.
*H01L 51/50*        (2006.01)
(52) U.S. Cl.
USPC .............. 257/40; 257/298; 257/68; 257/71
(58) Field of Classification Search
USPC ....................... 257/40, 298, 68, 71
See application file for complete search history.

(56) References Cited

U.S. PATENT DOCUMENTS

| 6,046,547 | A * | 4/2000 | Nishio et al. ............... 315/169.3 |
| 6,204,081 | B1 * | 3/2001 | Kim et al. ...................... 438/30 |
| 6,323,932 | B1 * | 11/2001 | Zhang et al. .................. 349/155 |
| 6,403,980 | B1 * | 6/2002 | Park ................................ 257/59 |
| 6,555,969 | B2 * | 4/2003 | Yamazaki ................ 315/169.3 |
| 6,583,472 | B1 * | 6/2003 | Shibata et al. ................ 257/350 |
| 6,605,826 | B2 * | 8/2003 | Yamazaki et al. ............. 257/72 |
| 6,921,918 | B2 * | 7/2005 | Park et al. ...................... 257/72 |
| 7,663,709 | B2 * | 2/2010 | Nagasawa ...................... 349/39 |
| 7,723,134 | B2 * | 5/2010 | Jo et al. .......................... 438/30 |
| 7,775,846 | B2 * | 8/2010 | Koo et al. ...................... 445/24 |
| 7,952,100 | B2 * | 5/2011 | Arasawa et al. ............... 257/72 |
| 8,188,647 | B2 * | 5/2012 | Kimura et al. ............... 313/498 |
| 8,274,090 | B2 * | 9/2012 | Choi et al. ..................... 257/88 |
| 8,421,944 | B2 * | 4/2013 | Kitakado ....................... 349/47 |
| 2003/0052597 | A1 * | 3/2003 | Sakurai ....................... 313/504 |
| 2006/0023130 | A1 * | 2/2006 | Jeoung et al. .................. 349/2 |
| 2006/0145160 | A1 * | 7/2006 | Park et al. ...................... 257/72 |
| 2007/0262347 | A1 | 11/2007 | You |
| 2008/0012470 | A1 * | 1/2008 | Heo et al. ..................... 313/500 |
| 2009/0286386 | A1 * | 11/2009 | Lee et al. ...................... 438/586 |
| 2011/0147757 | A1 * | 6/2011 | Kim et al. ...................... 257/71 |
| 2011/0315994 | A1 * | 12/2011 | Choi et al. ..................... 257/72 |
| 2012/0104405 | A1 * | 5/2012 | Choi et al. ..................... 257/72 |
| 2012/0193624 | A1 * | 8/2012 | You ................................ 257/57 |

FOREIGN PATENT DOCUMENTS

| KR | 10-2006-0001402 A | 1/2006 |
| KR | 10-2007-0109192 A | 11/2007 |

* cited by examiner

*Primary Examiner* — Eugene Lee
(74) *Attorney, Agent, or Firm* — Birch, Stewart, Kolasch & Birch, LLP

(57) ABSTRACT

An organic light emitting diode display device includes: a semiconductor layer on a substrate and including source and drain regions; a first insulating layer on the semiconductor layer; a gate electrode and a first storage electrode on the first insulating layer; a second insulating layer on the gate electrode and the first storage electrode; source and drain electrodes connected with the source and drain regions, respectively; a second storage electrode on the second insulating layer at a location corresponding to the first storage electrode; a third insulating layer on the source and drain electrodes and the second storage electrode; a first metal layer on the third insulating layer and connecting the drain electrode to an anode; and a second metal layer on the third insulating layer at a location corresponding to the second storage electrode.

7 Claims, 7 Drawing Sheets

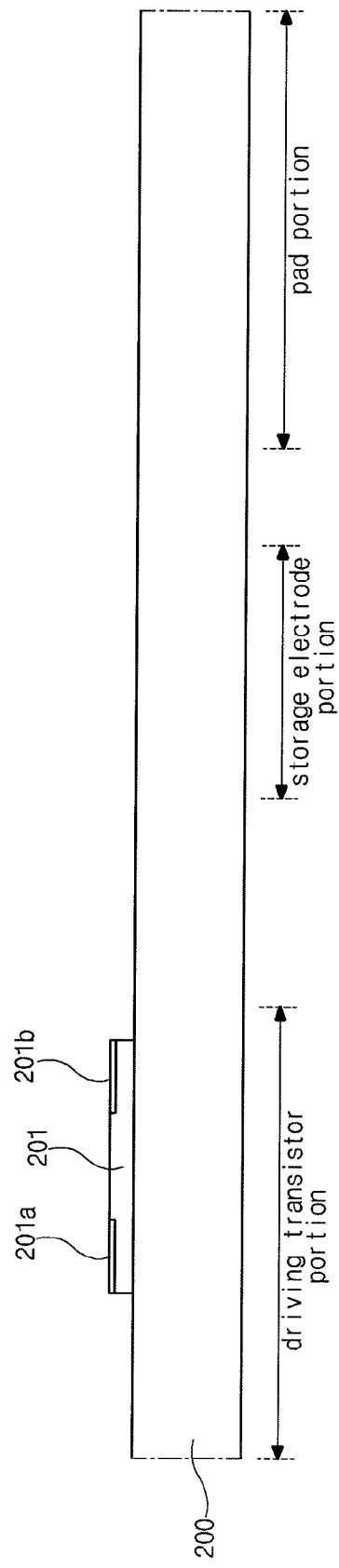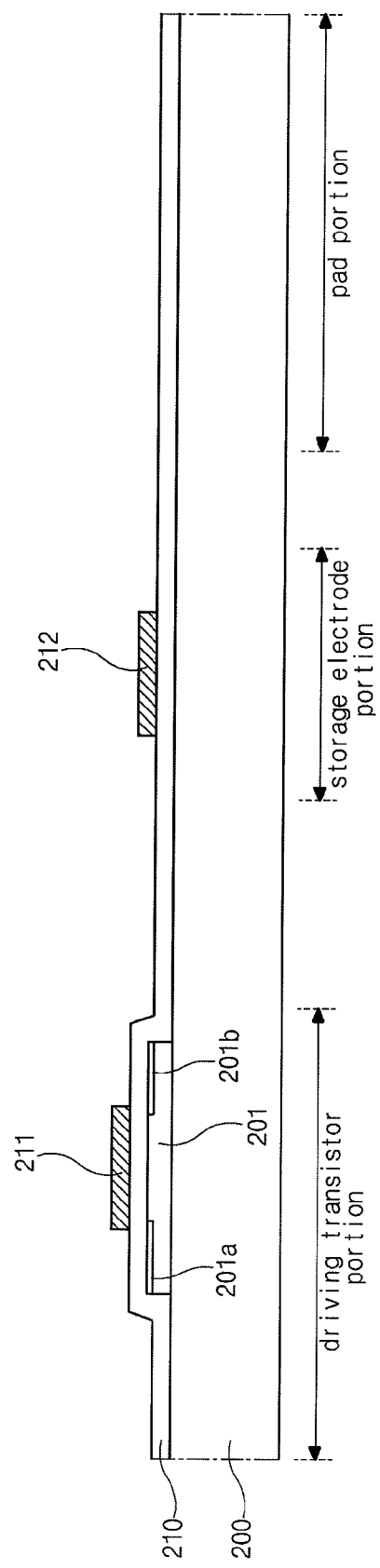

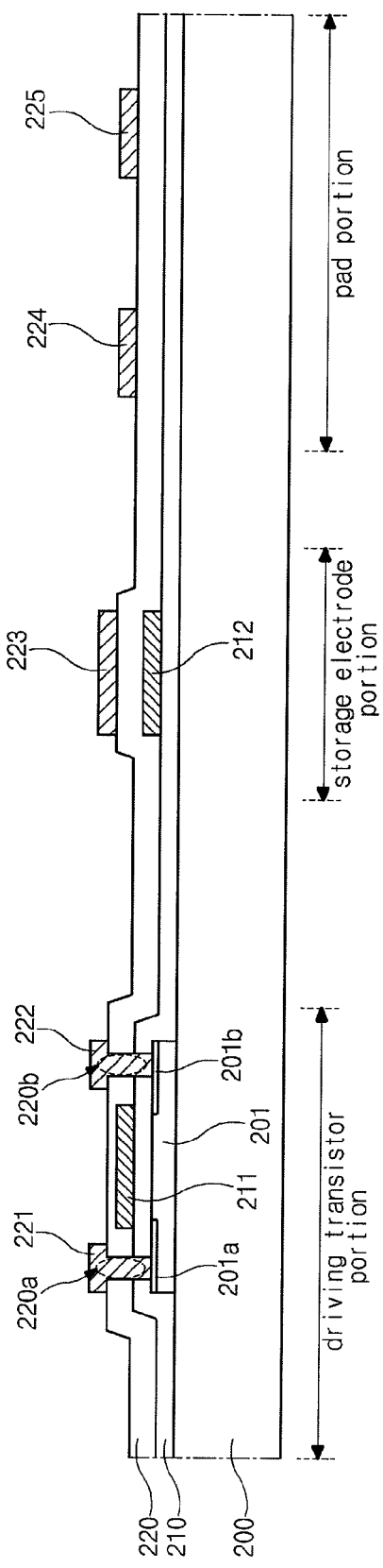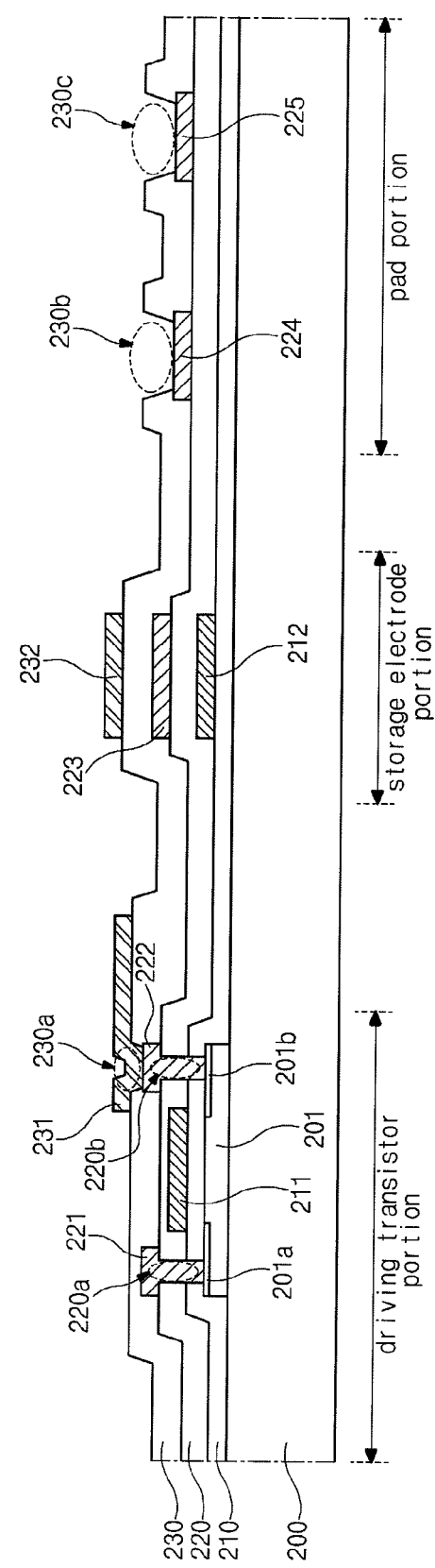

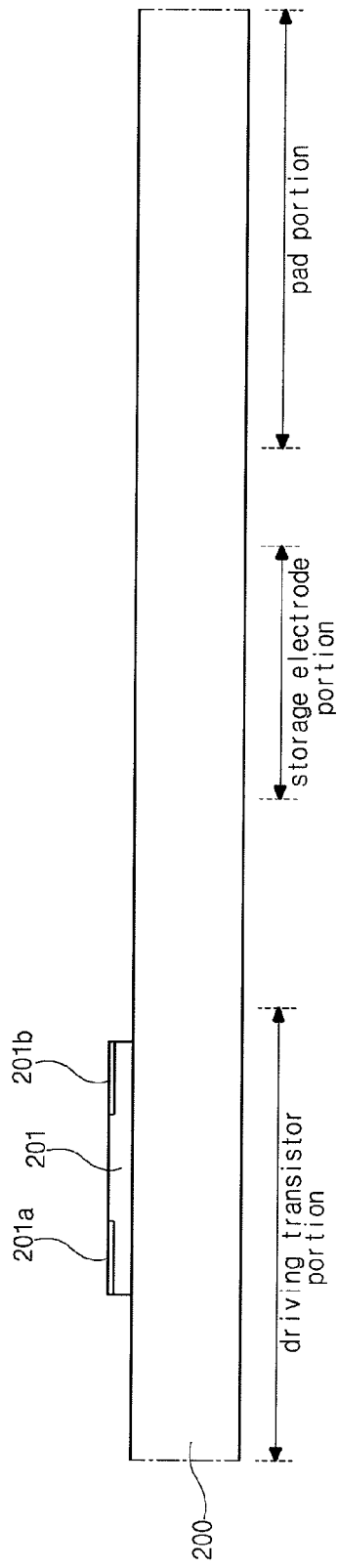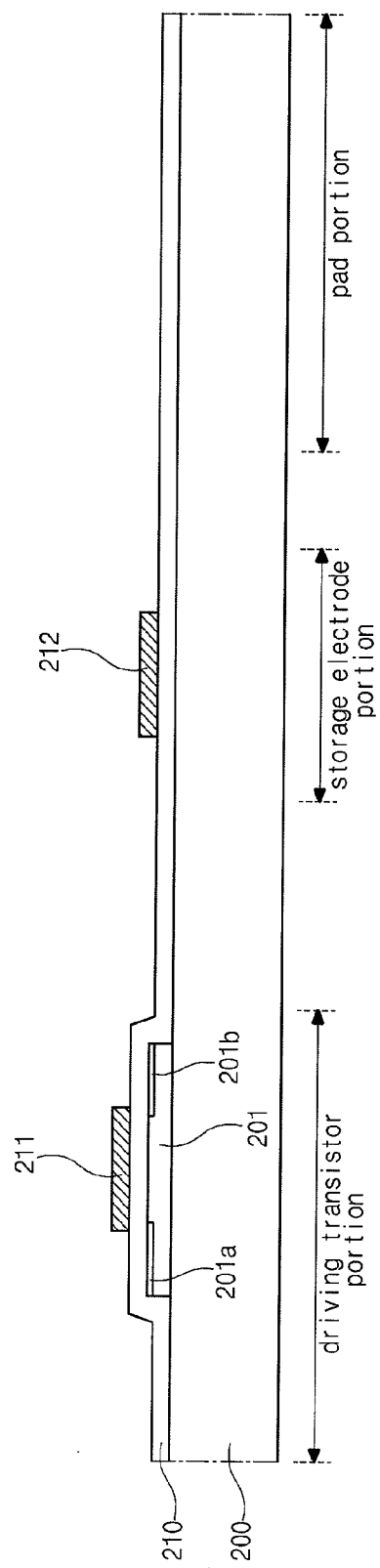

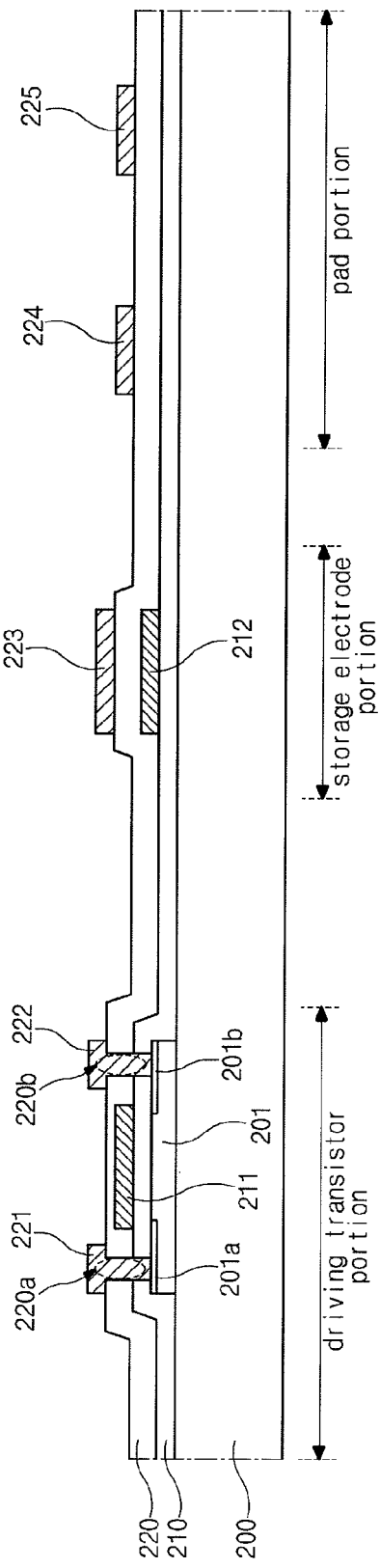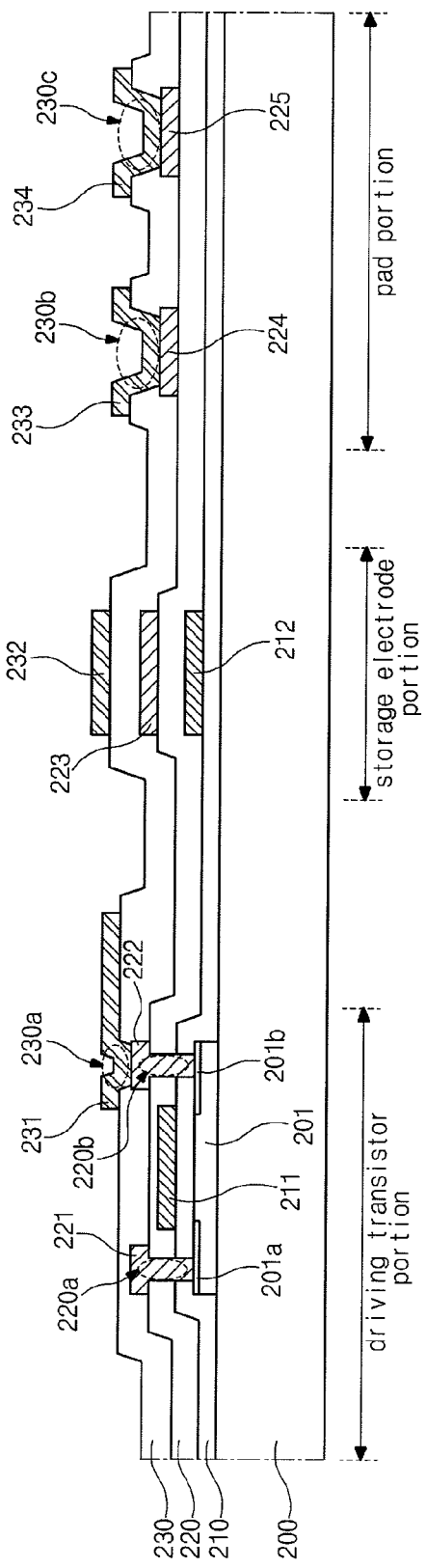

ORGANIC LIGHT EMITTING DIODE DISPLAY DEVICE AND METHOD OF MANUFACTURING THE SAME

CROSS REFERENCE TO RELATED APPLICATION

This application claims priority to and the benefit of Korean Patent Application No. 10-2012-0018612, filed in Korea on Feb. 23, 2012, which is hereby incorporated by reference for all purposes as if fully set forth herein.

BACKGROUND OF THE INVENTION

1. Field of the Invention

Embodiments of the invention relate to an organic light emitting diode display device and a method of manufacturing the same, and more particularly, to an organic light emitting diode display device and a method of manufacturing the same achieving high resolution in large size.

2. Discussion of the Related Art

Recently, many efforts and studies have been being made to develop flat panel displays, such as liquid crystal display (LCD) devices and organic light emitting diode (OLED) display devices, as substitute for cathode-ray tubes (CRTs).

Of these flat panel displays, since the OLED display devices are self-luminescent without a need for a light source, have a thinner profile, are lighter weight, and have better color reproduction than the LCD devices, the OLED display devices have come into the spotlight as next-generation display devices.

The OLED display device is generally categorized into a passive type and an active type. Among these types, the active type OLED display device, which includes a thin film transistor in each pixel and has low power consumption and advantage in resolution, is widely used to realize a high-resolution and large-sized image display device.

FIG. 1 is a cross-sectional view illustrating an active type OLED display device according to a related art. Referring to FIG. 1, in the related art OLED display device, a semiconductor layer 101 and a first storage electrode 102 are formed on a substrate 100. On the semiconductor layer 101 and the second storage electrode 102, a gate electrode 111, a source electrode 121, a drain electrode 122, a second storage electrode 112 and a third storage electrode 123 are formed with a plurality of insulating layers 110, 120, 130 and 140 located thereamong.

A gate pad 124 connected with a gate electrode of a switching transistor and a data pad 125 connected with a source electrode of the switching transistor are formed below the third insulating layer 130.

The source electrode 121 and the drain electrode 122 are formed on the second insulating layer 120, and the drain electrode 122 is connected with an anode 141. An organic light emitting layer 151 is formed on the anode 141 and a bank layer 150 formed on the fourth insulating layer 140.

A second storage electrode 112 is formed on the first insulating layer 110 corresponding to the first storage electrode 102. In a similar manner, a third storage electrode 123 is formed on the second insulating layer 120 corresponding to the second storage electrode 112. The storage electrodes 102, 112 and 123 function to produce a capacitance and maintain light emission of the organic light emitting layer 151 even when a gate signal is not applied. As the number of the storage electrodes 102, 112 and 123 is increased a capacitance sufficient to operate the organic light emitting layer 151 is achieved. However, since a size of each pixel region is limited, circuit design reducing the occupied area of the storage electrodes is required in order to achieve high resolution with high integration in the space limited pixel region.

Regarding a large-sized panel, a voltage drop occurs as a pixel is farther from a power supply terminal. If the voltage drop is not compensated, disuniformity of brightness may occur. Since the pixel regions have the same limited area, as components for compensation circuits including the storage electrodes increase, degree of integration is reduced and high resolution is thus difficult to achieve.

Further, since a third contact hole 140a is formed by etching two layers, and in particular, a height of the fourth insulating layer 140 formed for planarization is great, a step of the third contact hole 140a formed in the fourth insulating layer 140 is greater than other contact holes. The anode 141 formed on the third contact hole 140 having the great step is uneven in thickness or partially cut, and this may cause problems in electric connection.

Further, the gate pad 124 and the data pad 125 are exposed after the fourth contact hole 140b and the fifth contact hole 140c are formed. When the pads 124 and 125 are exposed for a long time until a layer is formed thereon, the pads 124 and 125 may be oxidized and damaged. The damage of the pads 124 and 125 may cause an unstable electric connection.

Among the storage electrodes 102, 112 and 123, the second storage electrode 112 and the third storage electrode 123 are made of metal while the first storage electrode 102 is made of a silicon group material, which is the same one of the semiconductor layer 101. Accordingly, to use the first storage electrode 102 as an electrode, an additional semiconductor process such as a doping process is required, and this reduces process efficiency.

SUMMARY OF THE INVENTION

Accordingly, embodiments of the invention are directed to an organic light emitting diode display device and a method of manufacturing the same that substantially obviates one or more of the problems due to limitations and disadvantages of the related art, and provide other advantages.

An advantage of the invention is to provide an organic light emitting diode display device and a method of manufacturing the same that can achieve high resolution, improve uniformity of brightness in large-size, increase stability in electric connection, and improve process efficiency.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, an organic light emitting diode display device includes: a substrate; a semiconductor layer on the substrate and including source and drain regions; a first insulating layer on the semiconductor layer; a gate electrode and a first storage electrode on the first insulating layer; a second insulating layer on the gate electrode and the first storage electrode; source and drain electrodes connected with the source and drain regions, respectively; a second storage electrode on the second insulating layer at a location corresponding to the first storage electrode; a third insulating layer on the source and drain electrodes and the second storage electrode; a first metal layer on the third insulating layer and connecting the drain electrode to an anode; and a second metal layer on the third insulating layer at a location corresponding to the second storage electrode.

In another aspect, a method of manufacturing an organic light emitting diode display device includes: sequentially forming a semiconductor layer and a first insulating layer on a substrate, the semiconductor layer including source and drain regions; forming a gate electrode and a first storage electrode on the first insulating layer; forming a second insulating layer on the gate electrode and the first storage electrode, and patterning the second insulating layer to form contact holes exposing the source and drain regions, respectively; forming source and drain electrodes at the contact holes, respectively, and a second storage electrode on the second insulating layer at a location corresponding to the first storage electrode; forming a third insulating layer on the source and drain electrodes and the second storage electrode; forming a first metal layer on the third insulating layer; and forming a second metal layer on the third insulating layer at a location corresponding to the second storage electrode.

It is to be understood that both the foregoing general description and the following detailed description are by way of example and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 4A to 4D are cross-sectional views illustrating a method of manufacturing the OLED display device according to the first embodiment of the invention; and FIGS. 5A to 5D are cross-sectional views illustrating a method of manufacturing the OLED display device according to the second embodiment of the invention.

DETAILED DESCRIPTION OF THE EMBODIMENTS

Reference will now be made in detail to illustrated embodiments of the invention, which are illustrated in the accompanying drawings.

Figure 2:
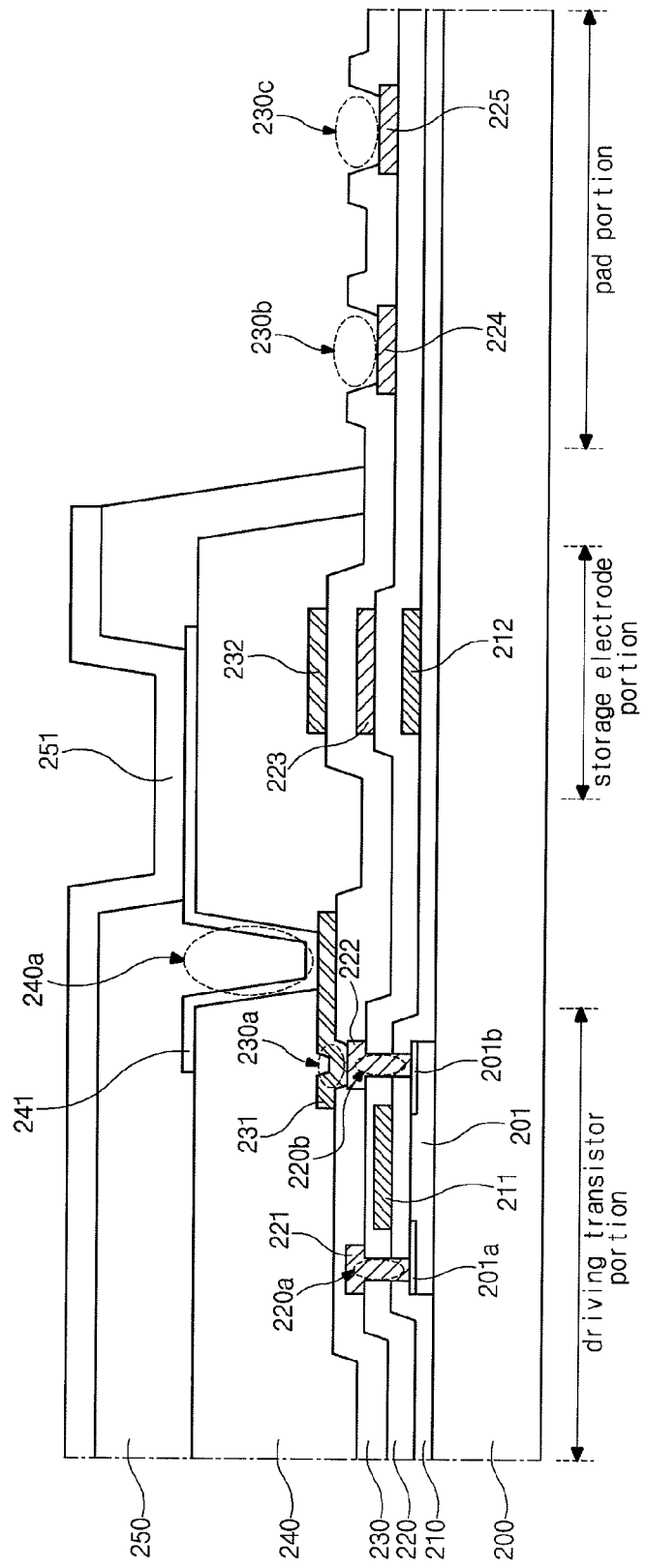
FIG. 2 is a cross-sectional view illustrating an OLED display device according to a first embodiment of the invention

FIG. 2 is a cross-sectional view illustrating an OLED display device according to a first embodiment of the invention. Referring to FIG. 2, the OLED display device of the first embodiment includes a substrate 200, a semiconductor layer 201, a plurality of insulating layers 210, 220, 230 and 240, a plurality of contact holes 220a, 220b, 230a, 230b, 230c and 240a, a gate electrode 211, a source electrode 221, a drain electrode 222, first and second storage electrodes 212 and 223, first and second metal layers 231 and 232, a bank layer 250 and an organic light emitting layer 251.

The semiconductor layer 201 is formed on the substrate 200 and includes a source region 201a and a drain region 201b. The first insulating layer 210 is formed on the semiconductor layer 201. The gate electrode 211 and the first storage electrode 212 are formed on the first insulating layer 210. The gate electrode 211 is supplied with a gate signal and produces a channel in the semiconductor layer 201.

The second insulating layer 220 is formed on the gate electrode 211 and the first storage electrode 212. When the second insulating layer 220 is patterned, the first and second contact holes 220a and 220b exposing the source and drain regions 201a and 201b, respectively, are formed, and the source and drain electrodes 221 and 222 are formed thereat. Thus, the source and drain electrodes 221 and 222 are connected with the source and drain regions 201a and 201b, respectively. Accordingly, when a gate electrode 211 is supplied with a signal, a channel is formed and a data signal is transferred from the source electrode 221 to the drain electrode 222.

The second storage electrode 223 is formed on the second insulating layer 220 at a location corresponding to (or overlapping) the first storage electrode 212. The third insulating layer 230 is formed on the source electrode 221, the drain electrode 222 and the second storage electrode 223. The second storage electrode 223 and the first storage electrode 212 together form a capacitor.

When the source electrode 221, the drain electrode 222 and the second storage electrode 223 are formed, a gate pad 224 connected with a gate electrode of a switching transistor and a data pad 225 connected with a source electrode of the switching transistor are formed. The gate pad 224 and the data pad 225 are formed on the second insulating layer 220.

A data signal applied to the data pad 225 is periodically transferred from the source electrode of the switching transistor to a drain electrode of the switching transistor according to a gate signal supplied from the gate pad 224, and is then transferred to the gate electrode 211 of a driving transistor portion connected with the drain electrode of the switching transistor. The data signal transferred to the gate electrode 211 forms a channel in the semiconductor layer 201, and a power voltage at the source electrode is thus transferred to the drain electrode 222. The power voltage is transferred to the organic light emitting layer 251 via the drain electrode 222 and operates the organic light emitting layer 251.

The first metal layer 231 is formed on the third insulating layer 230 to connect the drain electrode 222 to the anode 241. By patterning the third insulating layer 230, the first metal layer 231 is formed at the third contact hole 230a exposing the drain electrode 222. Further, when forming the third contact hole 230a, the fourth contact hole 230b and the fifth contact hole 230c exposing the gate pad 224 and the data pad 225, respectively, may be formed.

The first metal layer 231 may be made of a metal including one of molybdenum (Mo), copper (Cu) and aluminum (Al). In particular, the first metal layer 231 may have a double-layered structure of (or a multiple layer structure of), for example, aluminum-neodymium (AlNd)/molybdenum (Mo) or copper (Cu)/molybdenum-titanium (MoTi). An end of the first metal layer 231 is connected with the drain electrode 222, and the other end of the first metal layer 231 is connected with the anode 241, and to do this, the first metal layer 231 extends toward the anode 241. Since the first metal layer 231 transfers the power voltage to the anode 241 to operate the organic light emitting diode 251, the first metal layer 231 functions as a signal line in a pixel and also forms a mesh structure crossing a power voltage line. Through such a mesh structure of a signal line, a voltage transferred to a pixel farther from the power voltage terminal is compensated, and uniformity of brightness of a panel can thus be improved particularly for a large-sized OLED display device.

Figure 1:
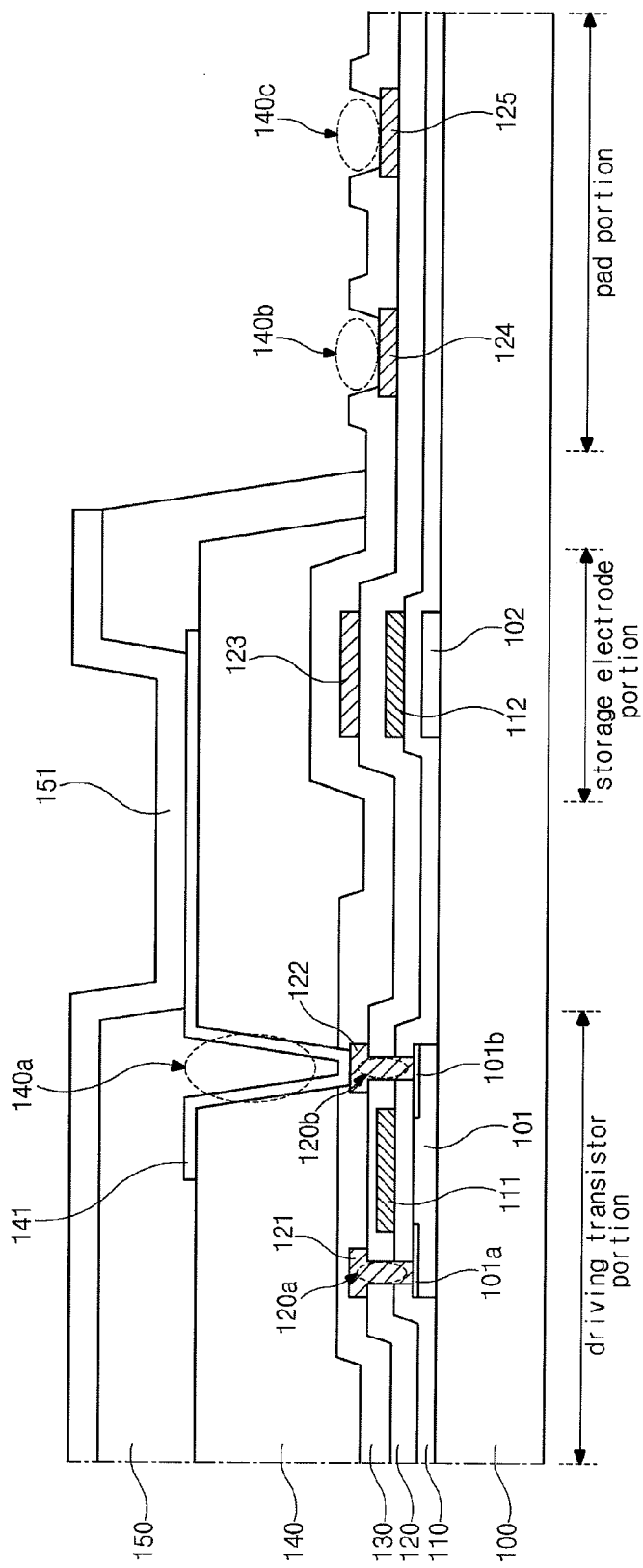
FIG. 1 is a cross-sectional view illustrating an active type OLED display device according to a related art.

The second metal layer 232 is formed on the third insulating layer 230 corresponding to the second storage electrode 223. Similar to the first metal layer 231, the second metal layer 232 may be made of a metal including one of molybdenum (Mo), copper (Cu) and aluminum (Al). In particular, the second metal layer 232 may have a double-layered structure of (or a multiple layer structure of), for example, aluminum-neodymium (AlNd)/molybdenum (Mo) or copper (Cu)/molybdenum-titanium (MoTi). The second metal layer 232 and the second storage electrode 223 together form a capacitor. Accordingly, using two storage electrodes 212 and 223 and one metal layer 232, a capacitance having an amount sufficient to maintain operation of the organic light emitting layer 251 can be formed. Accordingly, an additional doping process, as described with reference to FIG. 1 in the related art, is removed, and process efficiency can be thus improved.

The fourth insulating layer 240 is formed on the first and second metal layers 231 and 232. The fourth insulating layer 240 is a layer for planarization, and may be made of an organic material such as poly acryl. By patterning the fourth insulating layer 240, the sixth contact hole 240a is formed. The anode 241 is formed at the sixth contact hole 240a and directly contacts the first metal layer 231. The first metal layer 231 is formed between the third insulating layer 230 and the fourth insulating layer 240, and this makes a step of the sixth contact hole 240a be lower, and electric connection of the anode 241 can be thus stable.

The bank layer 250 is formed on the anode 241 and the fourth insulating layer 240, and the organic light emitting layer 251 is formed on the bank layer 250 and the anode 241. The organic light emitting layer 251 is supplied with the power voltage, which is applied to the drain electrode 222, from the anode 241 via the first metal layer 231 and emits light.

Figure 3:
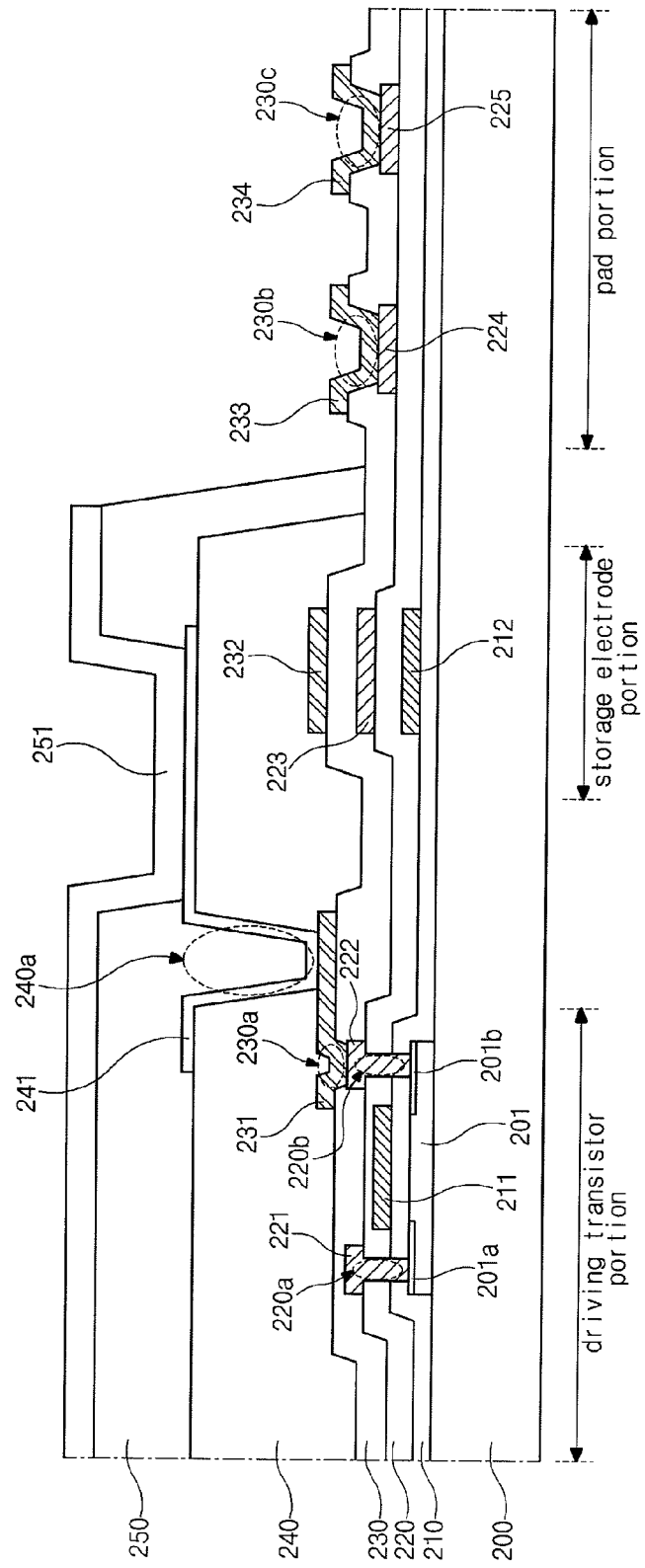
FIG. 3 is a cross-sectional view illustrating an OLED display device according to a second embodiment of the invention.

FIG. 3 is a cross-sectional view illustrating an OLED display device according to a second embodiment of the invention. The OLED display device of the second embodiment is similar to that of the first embodiment. Accordingly, explanations of parts similar to parts of the first embodiment may be omitted for the purpose of explanations.

A third insulating layer 230 is formed on a source electrode 221, a drain electrode 222, a second storage electrode 223, a gate pad 224 and a data pad 225 which are formed on a second insulting layer 220.

By patterning the third insulating layer 230, a third contact hole 230a exposing the drain electrode 222, and fourth and fifth contact holes 230b and 230c exposing the gate and data pads 224 and 225, respectively, are formed. Third and fourth metal layers 233 and 234 are formed at the fourth and fifth contact holes 230b and 230c, respectively, and this prevents the gate and data pads 224 and 225 from being damaged in production processes.

Similar to first and second metal layers 231 and 232, the third and fourth metal layers 233 and 234 may be made of a metal including one of molybdenum (Mo), copper (Cu) and aluminum (Al). In particular, the third and fourth metal layers 233 and 234 may have a double-layered structure of (or a multiple layer structure of), for example, aluminum-neodymium (AlNd)/molybdenum (Mo) or copper (Cu)/molybdenum-titanium (MoTi).

Further, since the first to fourth metal layers 231 to 234 are all on the third insulating layer 230, the metal layers 231 to 234 can be simultaneously formed in one process. Since the metal layers 231 to 234 having various functions are simultaneously formed, burden in production process can be reduced despite employment of a new structure.

A method of manufacturing the OLED display device according to the first embodiment of the invention is explained with reference to FIGS. 4A to 4D. FIGS. 4A to 4D are cross-sectional views illustrating a method of manufacturing the OLED display device according to the first embodiment of the invention. Referring to FIG. 4A, a semiconductor layer 201 including source and drain regions 201a and 201b is first formed on a substrate 200. The source and drain regions 201a and 201b include P (positive) type or N (negative) type impurities, and the semiconductor layer 201 may be formed of amorphous silicon, polysilicon, or an oxide.

Then, referring to FIG. 4B, a first insulating layer 210 is formed on the semiconductor layer 201, and a gate electrode 211 and a first storage electrode 212 are formed on the first insulating layer 210. The gate electrode 211 and the first storage electrode 212 may be formed by depositing a metal on the first insulating layer 210 using a sputtering process and then etching an unnecessary portion using a dry etching. Molybdenum (Mo) may be used as the metal. Other metals or materials maybe used.

Then, referring to FIG. 4C, a second insulating layer 220 is formed on the gate electrode 211 and the first storage electrode 212 and is then patterned to form first and second contact holes 220a and 220b exposing the source and drain regions 201a and 201b, respectively. In more detail, a photoresist is coated on the second insulating layer 220, and light exposure and developing are then conducted to form a photoresist pattern. The photoresist pattern is formed such that the photoresist remains on the second insulating layer 220 except for regions where the first and second contact holes 220a and 220b are formed. Then, the second insulating layer 220 and the first insulating layer 210 are etched in the regions, where the photoresist is removed, using wet etching, and the source and drain regions 201a and 201b are exposed.

Then, source and drain electrodes 221 and 222 are formed using a metal including one of molybdenum (Mo) and aluminum-neodymium (AlNd) and directly connected with the source and drain regions 201a and 201b, respectively. The source and drain electrodes 221 and 222 are formed using a sputtering process and may be formed to have a single metallic layer or multiple metallic layers of a thickness of hundreds of angstroms to thousands of angstroms. Further, a second storage electrode 223 is formed on the second insulating layer 220 corresponding to the first storage electrode 212. The second storage electrode 223 may be formed in the same process of forming the source and drain electrodes 221 and 222.

Then, referring to FIG. 4D, a third insulating layer 230 is formed on the source and drain electrodes 221 and 222 and the second storage electrode 223. The third insulating layer 230 may be made of an insulating material, for example, silicon nitride (SiNx) or silicon oxide ($SiO_2$), using plasma-enhanced chemical vapor deposition (PECVD). Then, in a similar manner to formation of the first and second contact holes 220a and 220b, a third contact hole 230a exposing the drain electrode 222 is formed, and a first metal layer 231 is formed at the third contact hole 230a. The first metal layer 231 is formed to have a predetermined length such that an end of the first metal layer 231 is connected with the drain electrode 222, and the other end of the first metal layer 231 is connected with an anode 241 to be formed later.

Further, a second metal layer 232 is formed on the third insulating layer 230 corresponding to the second storage electrode 223. The second metal layer 232 and the second storage electrode 223 together form a capacitor, and a capacitance of an amount sufficient to maintain operation of the organic light emitting layer 251 can be thus formed. Further, since the second metal layer 232 is formed using a simple process, an additional doping process can be omitted, and process efficiency can be thus improved.

A method of manufacturing the OLED display device according to the second embodiment of the invention is explained with reference to FIGS. 5A to 5D. FIGS. 5A to 5D are cross-sectional views illustrating a method of manufacturing the OLED display device according to the second embodiment of the invention. Processes of FIGS. 5A to 5C are substantially the same as those of FIGS. 4A to 4C, and explanations thereof may be omitted.

Referring to FIG. 5D, a third insulating layer 230 is formed on a source electrode 221, a drain electrode 222, a second storage electrode 223, a gate pad 224 and a data pad 225 and patterned to form a third contact hole 230a, a fourth contact hole 230b and a fifth contact hole 230c. The fourth and fifth contact holes 230b and 230c can be formed along with the third contact hole 230a by etching the third insulating layer 230 using a photolithography process. Then, first to fourth metal layers 231 to 234 are formed at the third contact hole 230a, on the third insulating layer 230 corresponding to the second storage electrode 223, at the fourth contact hole 230b, and at the fifth contact hole 230c, respectively.

Further, by forming new metal layers 231, 232, 233 and 234 instead of reducing the number of electrodes in a storage electrode portion, design of a pixel driving portion can be easier in a limited area, and high integration and high resolution can be achieved. In particular, when the first metal layer 231 connected with the anode 241 crosses a power voltage line to form a mesh structure, voltage of a power source portion is compensated and uniformity of brightness can be thus improved. Therefore, high resolution can be achieved even for a large-sized OLED display device, and also, uniformity of brightness can be improved.

As described above, according to the embodiments of the invention, since a storage electrode are replaced with a new metal layer, degree of freedom of circuit design is obtained. Accordingly, through high integration, there is advantage in realization of high resolution.

Further, according to the embodiments of the invention, a new metal layer and a power portion connected with an anode are configured in a mesh structure. Accordingly, uniformity of brightness can be improved for a large-sized panel as well as a small-sized panel.

Further, according to the embodiments of the invention, a step of a contact portion of an anode is reduced due to a new metal layer. Accordingly, stability of electric connection can increase.

Further, according to the embodiments of the invention, a storage electrode formed using an additional doping process is replaced with a new metal layer. Accordingly, process efficiency can be improved.

It will be apparent to those skilled in the art that various modifications and variations can be made in the invention without departing from the spirit or scope of the invention. Thus, it is intended that the invention cover the modifications and variations of this invention provided they come within the scope of the appended claims and their equivalents.

What is claimed is:

1. An organic light emitting diode display device, comprising:
   a substrate;
   a semiconductor layer on the substrate and including source and drain regions;
   a first insulating layer on the semiconductor layer;
   a gate electrode and a first storage electrode on the first insulating layer;
   a second insulating layer on the gate electrode and the first storage electrode;
   source and drain electrodes connected with the source and drain regions, respectively;
   a second storage electrode on the second insulating layer at a location corresponding to the first storage electrode;
   a third insulating layer on the source and drain electrodes and the second storage electrode;
   a first metal layer on the third insulating layer and the drain electrode at a location corresponding to the drain region, and connecting the drain electrode to an anode; and
   a second metal layer on the third insulating layer at a location corresponding to the second storage electrode and the first storage electrode.

2. The device according to claim 1, further comprising gate and data pads on the second insulating layer, the gate and data pads being exposed by the third insulating layer; and
   third and fourth metal layers on the gate and data pads, respectively.

3. The device according to claim 2, wherein the first to fourth metal layers are made of the same material.

4. The device according to claim 2, wherein the first to fourth metal layers each have a single layer or multiple layers.

5. The device according to claim 2, wherein the first to fourth metal layers are each made of a metal including at least one of molybdenum (Mo), copper (Cu), aluminum (Al), neodymium (Nd) and titanium (Ti).

6. The device according to claim 4, wherein the multiple layers include aluminum-neodymium (AlNd) and molybdenum (Mo) layers or copper (Cu) and molybdenum-titanium (MoTi) layers.

7. The device according to claim 1, further comprising a fourth insulating layer on the first metal layer, the second metal layer, and the third insulating layer, and the fourth insulating layer separating the first metal layer and the second metal layer.

* * * * *